(12) United States Patent
Bikulcius (10) Patent No.: US 6,661,079 B1
(45) Date of Patent: Dec. 9, 2003

(54) SEMICONDUCTOR-BASED SPIRAL CAPACITOR

(75) Inventor: Simon Bikulcius, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 100 days.

(21) Appl. No.: 10/078,844

(22) Filed: Feb. 20, 2002

(51) Int. Cl.[7] .............................................. H01L 29/00
(52) U.S. Cl. ....................................... 257/532; 257/531
(58) Field of Search ................................ 257/530–535, 257/295–310; 438/253–254, 957

(56) References Cited

U.S. PATENT DOCUMENTS

| | | | | |
|---|---|---|---|---|
| 5,111,169 A | * | 5/1992 | Ikeda .......................... | 333/181 |
| 6,297,524 B1 | * | 10/2001 | Vathulya et al. ............ | 257/303 |
| 6,383,858 B1 | * | 5/2002 | Gupta et al. ................. | 438/238 |

OTHER PUBLICATIONS

Hirad Samavati et al., "Fractal Capacitors", IEEE Journal of Solid–State Circuits, vol. 33, No. 12, Dec. 1998, pps. 2035–2041.

Roberto Aparicio and Ali Hajimiri, "Capacity Limits and Matching Properties of Lateral Flux Integrated Capacitors", Department of Electrical Engineering, California Institute of Technology, Pasadena, CA, IEEE 2001 Custom Integrated Circuits Conference, pps. 365–368.

* cited by examiner

*Primary Examiner*—Cuong Nguyen
(74) *Attorney, Agent, or Firm*—Mark C. Pickering

(57) ABSTRACT

Increased capacitance per unit of area with reduced series resistance and inductance is provided by a semiconductor-based capacitor with a spiral shape. The capacitor utilizes a plurality of patterned metal layers that each have a first trace with a spiral shape and a second trace with a spiral shape. The second trace is formed between the loops of the first trace, and around the first trace.

20 Claims, 5 Drawing Sheets

SEMICONDUCTOR-BASED SPIRAL CAPACITOR

BACKGROUND OF THE INVENTION

1. Field of the Invention.

The present invention relates to capacitors and, more particularly, to a semiconductor-based spiral capacitor.

2. Description of the Related Art.

A capacitor is a device with two conductors separated by a dielectric that accumulates and holds an electric charge. Capacitors are common circuit elements and are frequently used in semiconductor devices. Semiconductor-based capacitors include lateral flux capacitors, vertical flux capacitors, and combined lateral and vertical flux capacitors.

Figure 1:
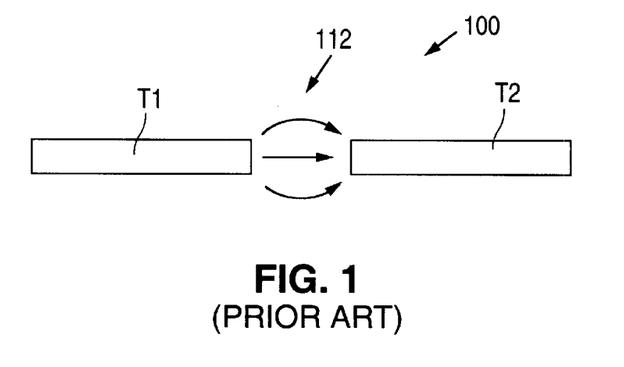
FIG. 1 is a cross-sectional view illustrating a prior art lateral flux capacitor 100.

FIG. 1 shows a cross-sectional view that illustrates a prior art lateral flux capacitor 100. As shown in FIG. 1, lateral flux capacitor 100 includes a first metal trace T1, a second metal trace T2, and a dielectric region 112 that is formed between metal traces T1 and T2. Metal traces T1 and T2 are formed from the same layer of metal, and are horizontally separated from each other. In this configuration, the flux lines are lateral, and go from trace T1 to trace T2 when trace T1 is positive with respect to trace T2.

Figure 2:
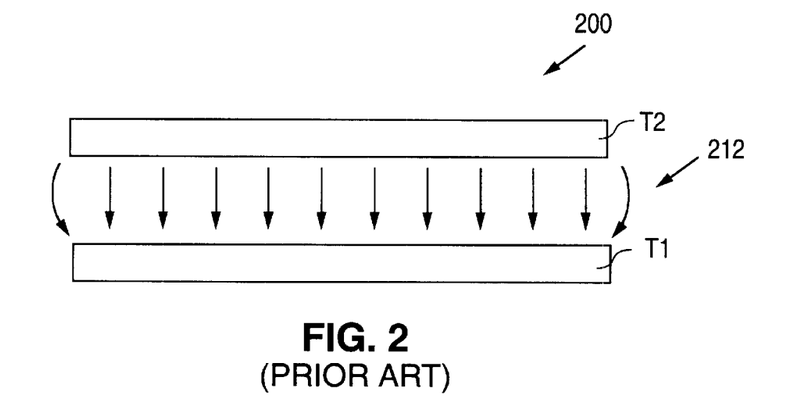
FIG. 2 is a cross-sectional view illustrating a prior art vertical flux capacitor 200.

FIG. 2 shows a cross-sectional view that illustrates a prior art vertical flux capacitor 200. As shown in FIG. 2, vertical flux capacitor 200 includes a first metal trace T1, a second metal trace T2, and a dielectric region 212 that is formed between metal traces T1 and T2. Metal traces T1 and T2 are formed from adjacent layers of metal, and are vertically separated from each other. In this configuration, the flux lines are vertical, and go from trace T2 to trace T1 when trace T2 is positive with respect to trace T1.

Figure 3:
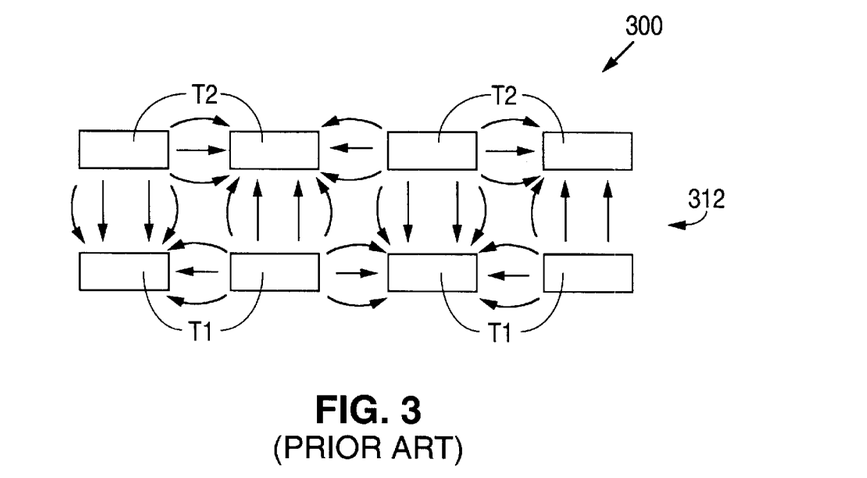
FIG. 3 is a cross-sectional view illustrating a prior art lateral and vertical flux capacitor 300.

FIG. 3 shows a cross-sectional view that illustrates a prior art lateral and vertical flux capacitor 300. As shown in FIG. 3, lateral and vertical flux capacitor 300 includes a number of first metal traces T1, a number of second metal traces T2, and a dielectric region 312 that is formed between metal traces T1 and T2.

The first metal traces T1 are formed from a first layer of metal to be horizontally separated from each other, while the second metal traces T2 are formed from an adjacent layer of metal to be horizontally separated from each other, and vertically separated from the first metal traces T1. Further, the polarity of the metal traces alternates both is horizontally and vertically. In this configuration, both lateral and vertical flux lines are present.

One problem with semiconductor-based capacitors is that semiconductor-based capacitors can be quite large and consume significant amounts of silicon real estate. As a result, a number of approaches have been used to increase the capacitive density of a capacitor to thereby reduce the size of the capacitor.

Figure 4:
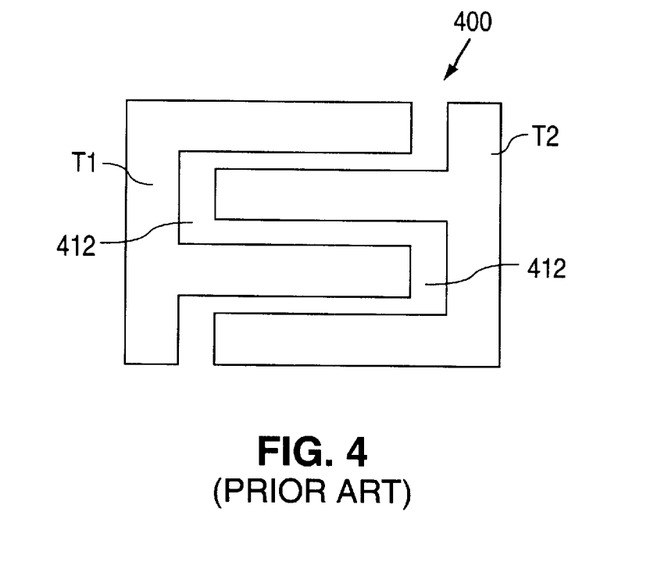
FIG. 4 is a plan view illustrating a prior art capacitor 400 that has an increased capacitive density.

FIG. 4 shows a plan view that illustrates a prior art capacitor 400 that has an increased capacitive density. As shown in FIG. 4, capacitor 400 includes a first metal trace T1, a second metal trace T2, and a dielectric region 412 that is formed between metal traces T1 and T2. Metal traces T1 and T2 are formed from the same layer of metal, horizontally separated from each other, and interdigitated. In this interdigitated configuration, capacitor 400 provides substantially more capacitance per unit of area than does capacitor 100.

Figure 5:
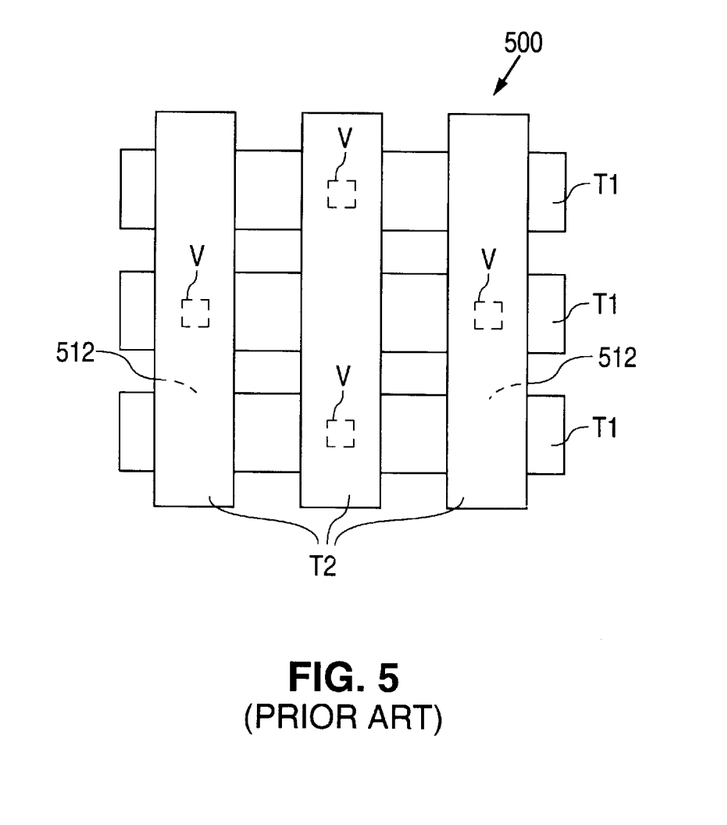
FIG. 5 is a plan view illustrating a prior art capacitor 500 that also has an increase capacitive density.

FIG. 5 shows a plan view that illustrates a prior art capacitor 500 that also has an increased capacitive density. As shown in FIG. 5, capacitor 500, which has a weave structure, includes a number of first metal traces T1, a number of second metal traces T2, and a dielectric region 512 that is formed between metal traces T1 and T2.

The first metal traces T1 are formed from a first layer of metal to be horizontally separated from each other, while the second metal traces T2 are formed from an adjacent layer of metal to be horizontally separated from each other, and vertically separated from the first metal traces.

In addition, the second metal traces T2 are orthogonally-oriented with respect to the first metal traces T1, while the polarity of the metal traces in each layer horizontally alternates. Further, vias V are used to vertically interconnect metal traces which have the same polarity. This configuration provides increased capacitance per unit area, but with less inherent series inductance.

Other structures, such as fractal capacitors, have also been used. Although semiconductor-based capacitors can be formed as described above, there is a need for an alternate capacitor structure that provides a high capacitance per unit area.

SUMMARY OF THE INVENTION

The present invention provides a capacitor that is formed in a semiconductor material of a first conductivity type. A capacitor in accordance with the present invention includes a first layer of isolation material that is formed on the semiconductor material, and a first metal trace that is formed on the first layer of isolation material. The first metal trace has a first center point, a first end point, and a spiral shape with loops that extends away from the first center point to the first end point.

The capacitor also includes a second metal trace that is formed on the first layer of isolation material. The second metal trace has a second center point, a second end point, and a spiral shape with loops that extends away from the second center point to the second end point. The second metal trace is formed between the loops of the first metal trace, and around the first metal trace.

A capacitor in accordance with the present invention also has a plurality of layers of isolation material that are formed over the semiconductor material. A first layer of isolation material is formed on the semiconductor material. Other than the first layer of isolation material, each layer of isolation material is formed on a preceding layer of isolation material.

The capacitor further has a plurality of spaced apart metal layers that correspond to the plurality of layers of isolation material. Each metal layer is formed on a corresponding layer of isolation material and has a first metal trace and a second metal trace. The first metal trace has a first center point, a first end point, and a spiral shape with loops that extends away from the first center point to the first end point.

The second metal trace has a second center point, a second end point, and a spiral shape that extends away from the second center point to the second end point. The second metal trace is formed between the loops of the first metal trace, and around the first metal trace.

The capacitor additionally has a plurality of vias that are formed in the second and greater layers of isolation material. The vias make electrical connections between each vertically adjacent first metal trace, and each vertically adjacent second metal trace.

Further, the capacitor can also include a plurality of first bridges that are formed on a top layer of isolation material over loops of a first metal trace of a top layer of capacitor metal. The capacitor can additionally include a plurality of first bridge vias that make an electrical connection with the first bridges and loops of the first metal trace of the top layer of capacitor metal.

The capacitor can further include a plurality of second bridges that are formed on the top layer of isolation material over loops of a second metal trace of the top layer of capacitor metal, and a plurality of second bridge vias. The second bridge vias make an electrical connection with the second bridges and loops of the second metal trace of the top layer of capacitor metal.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIG. 8 is a plan view illustrating a spiral capacitor structure 800 in accordance with the present invention. FIG. 8B is a circuit symbol representing capacitor structure 800 in accordance with the present invention. FIG. 8C is an alternate circuit symbol representing capacitor structure 800 in accordance with the present invention.

DETAILED DESCRIPTION

Figure 6A:
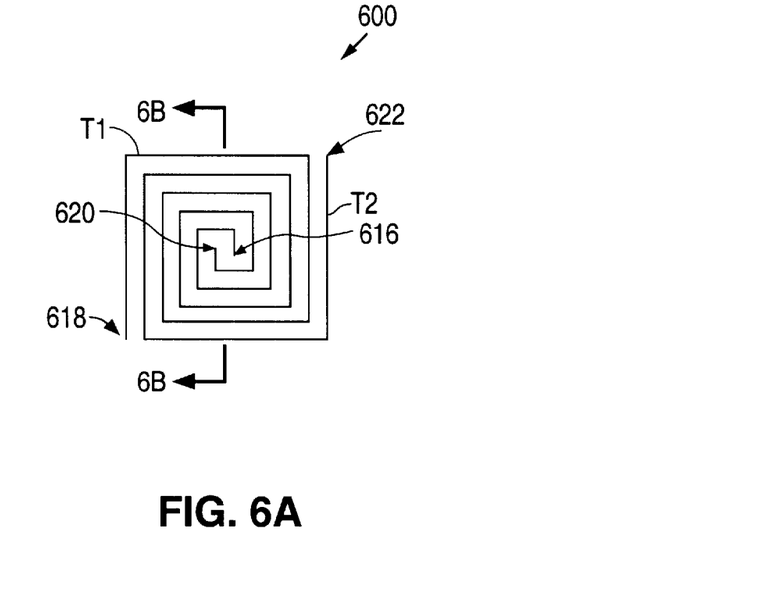
FIG. 6A is a plan view illustrating a spiral capacitor 600 in accordance with present invention.
Figure 6B:
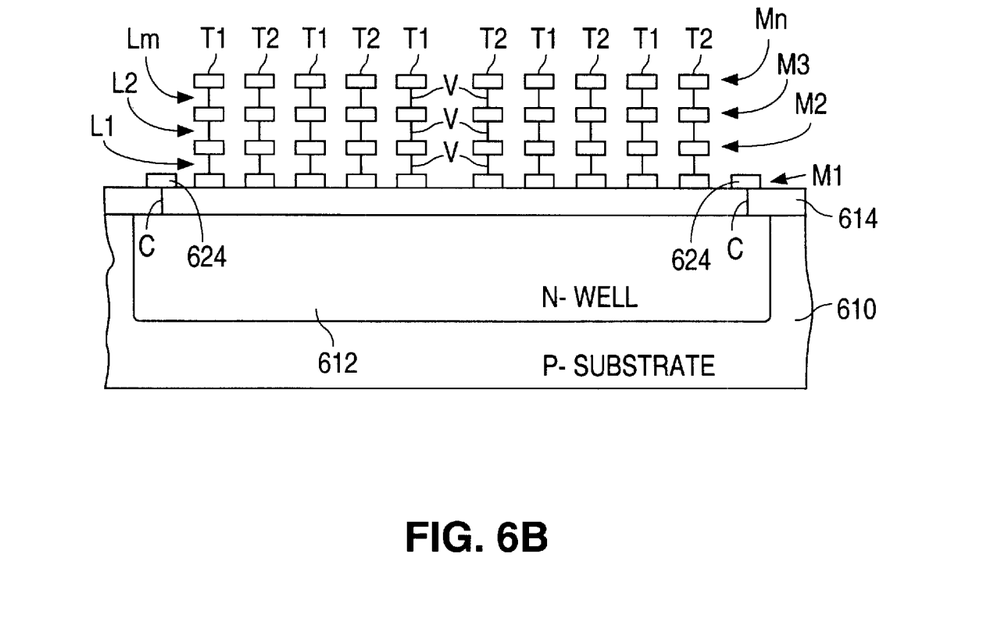
FIG. 6B shows a cross-sectional view taken along line of 6B—6B of FIG. 6A.

FIG. 6A shows a plan view that illustrates a spiral capacitor 600 in accordance with the present invention. FIG. 6B shows a cross-sectional view taken along line 6B—6B of FIG. 6A. As shown in FIGS. 6A and 6B, spiral capacitor 600, which is formed in a p-type substrate 610, includes an n-type well 612 that is formed in substrate 610.

As further shown in FIGS. 6A and 6B, spiral capacitor 600 includes a first layer of isolation material 614 that is formed on well 612, and a number of contacts C that are formed through isolation layer 614 to make an electrical connection with n-well 612. Isolation layer 614 can be implemented with, for example, a layer of field oxide.

Spiral capacitor 600 also includes a number of patterned metal layers M1-Mn, and a number of insulation layers L1-Lm that are formed between the patterned metal layers M1-Mn so that each vertically adjacent pair of metal layers are separated by an insulation layer.

Each metal layer M, in turn, has two metal traces T1 and T2. Metal trace T1 has a center point 616, an end point 618, and a counterclockwise spiral (a square-shaped spiral is illustrated in the drawings) that extends away from center point 616 to end point 618.

Metal trace T2 has a center point 620, an end point 622, and a counterclockwise spiral that extends away from center point 620 to end point 622. (Traces T1 and T2 can alternately both have a clockwise spiral.) Center point 620 is formed within the first half circle of trace T1 from center point 616, and is formed between the loops of metal trace T1 and around metal trace T1.

Metal traces T1 and T2 are formed so that the horizontal spacing between traces T1 and T2 is approximately equal to the minimum spacing that can be photolithographically obtained with the process, but must be large enough to accomodate vias. Although process dependent, the width of a trace is accurate to approximately +/−3 sigma, the thickness of the trace is accurate to approximately +/−3 sigma, and the horizontal spacing between traces is accurate to approximately +/−3 sigma.

In addition, the metal trace in each layer after the first layer lies over, and is substantially vertically aligned with, the corresponding trace in the underlying layer. For example, metal trace T1 of the second patterned metal layer M2 is formed over, and substantially vertically aligned with, metal trace T1 of the first patterned metal layer M1. Similarly, metal trace T2 of the second patterned metal layer M2 is formed over, and substantially vertically aligned with, metal trace T2 of the first patterned metal layer M1.

As shown in FIG. 6B, spiral capacitor 600 additionally includes a number of vias V that are formed through each layer of insulation material L1-Lm. The vias provide electrical connections between a metal trace in one metal layer and a corresponding metal trace in an adjacent metal layer.

For example, the vias V formed through first insulation layer L1 provide electrical connections between metal trace T1 in the second metal layer M2 and metal trace T1 in the first metal layer M1. Similarly, the vias V in the first insulation layer L1 also provide electrical connections between metal trace T2 in the second metal layer M2 and metal trace T2 in the first metal layer M1.

Further, spiral capacitor 600 includes a power trace 624 that is formed on isolation layer 614 to make an electrical connection with the contacts C. Trace 624, which is formed from the first metal layer M1, can be positively or negatively biased, and can have the same or the opposite bias as p-type substrate 610.

In operation, metal trace T1 in each metal layer M represents a first plate of a capacitor, while metal trace T2 in each metal layer M represents a second plate of a capacitor. In this configuration, the coupling capacitance from spiral capacitor 600 to well 612 is approximately ⅕ the capacitance of capacitor 600. This proportion is almost independent of the number of metal layers that are used to form capacitor 600.

Figure 7A:
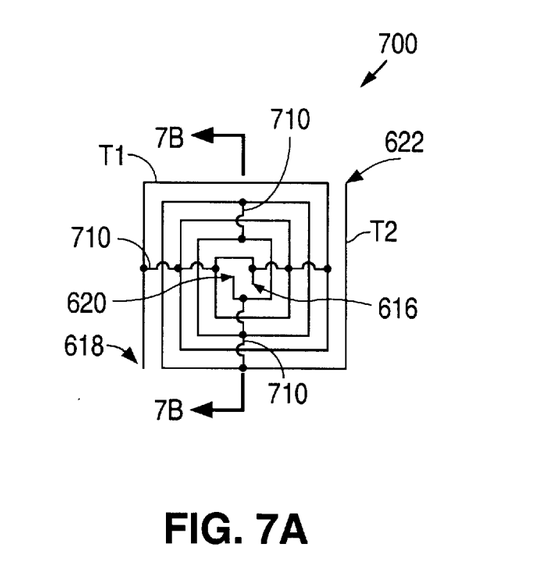
FIG. 7A is a plan view illustrating a spiral capacitor 700 in accordance with the present invention.
Figure 7B:
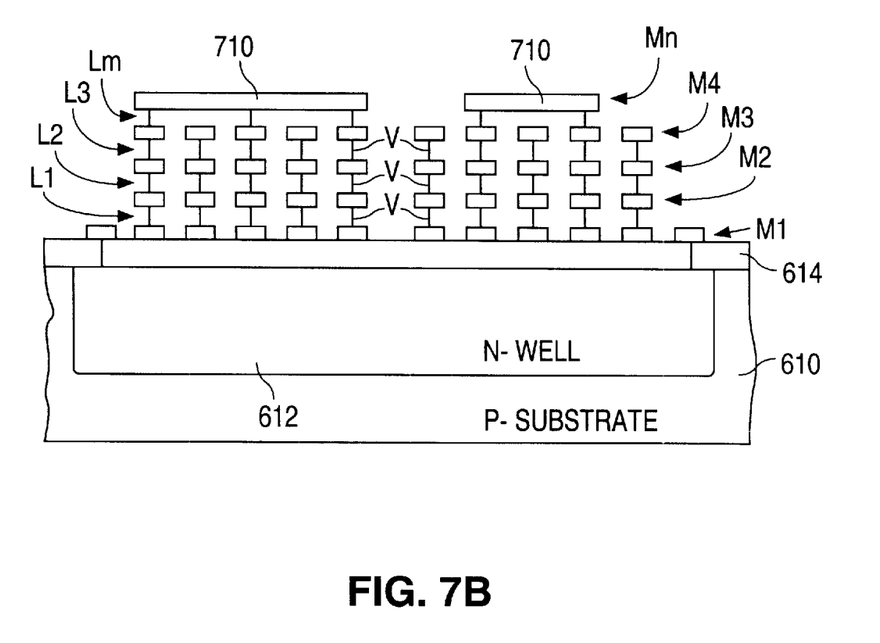
FIG. 7B is a cross-sectional view taken along line 7B—7B of FIG. 7A.

FIG. 7A shows a plan view that illustrates a spiral capacitor 700 in accordance with the present invention. FIG. 7B shows a cross-sectional view taken along line 7B—7B of FIG. 7A. Spiral capacitor 700 is similar to spiral capacitor 600 and, as a result, utilizes the same reference numerals to designate the structures that are common to both devices.

As shown in FIGS. 7A and 7B, spiral capacitor 700 differs from capacitor 600 in that capacitor 700 utilizes the top metal layer Mn to form a number of bridge connections 710. The bridge connections 710 are connected to the vias V in the top insulation layer Lm to make electrical connections between the loops of a trace.

In the example shown in FIG. 7A, trace T1 has between two and three loops. Bridge connections 710 and vias V are connected to various loops at various locations on the spiral of trace T1. Similarly, trace T2 has between two and three loops. Bridge connections 710 and vias V are connected to various loops at various locations on the spiral of trace T2. Bridge connections 710 reduce the series resistance and inductance of spiral capacitor 700.

Any number of metal layers M can be utilized, but using more metal layers increases the capacitance density per unit area. In addition, capacitance is increased by using the minimum width spacing between adjacent traces T1 and T2.

One of the advantages of the alternate embodiment is that, when stretched out, the spiral shape of the present invention forms two very long metal lines with high series resistance and inductance. By spiraling the lines and bridging another metal trace over the spiral, both resistance and inductance are reduced.

One advantage of the present invention is that spiral capacitors 600 and 700 are relatively compact. In a current generation process which utilizes six metal layers, spiral capacitor 700 (top metal layer used for bridge connections 710) is approximately two times the size of a conventional accumulation capacitor. (An accumulation capacitor is a PMOS transistor with the source, drain, and well tied to the most negative supply and the gate of the device used as a capacitor.)

Figures 8A, 8B, 8C:
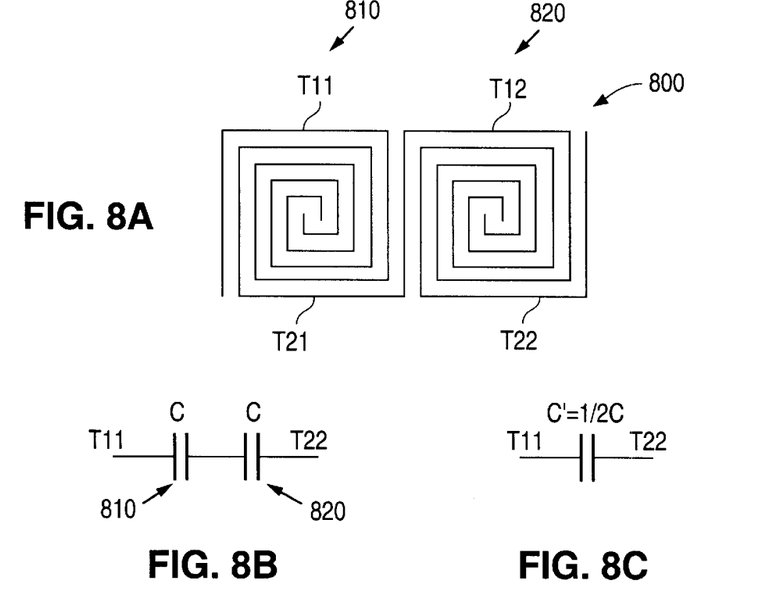

FIG. 8A shows a plan view that illustrates a spiral capacitor structure 800 in accordance with the present invention. FIG. 8B shows a circuit symbol that represents capacitor structure 800, while FIG. 8C shows an alternate circuit symbol that represents capacitor structure 800 in accordance with the present invention.

As shown in FIG. 8A, capacitor structure 800 includes a first capacitor 810 and a second capacitor 820. First capacitor 810 has a first trace T11, a second trace T21, and can be implemented as capacitor 600 or capacitor 700. Second capacitor 820 has a first trace T12, a second trace T22, and can be implemented as capacitor 600 or capacitor 700.

In capacitor 800, the last leg of metal trace T21 of first capacitor 810 and the first leg of metal trace T12 of second capacitor 820 are the same. The result, as shown in FIGS. 8B–8C, is that capacitor structure 800 is the electrical equivalent of two capacitors (capacitor 600 or 700) in series.

Figures 9A, 9B, 9C:
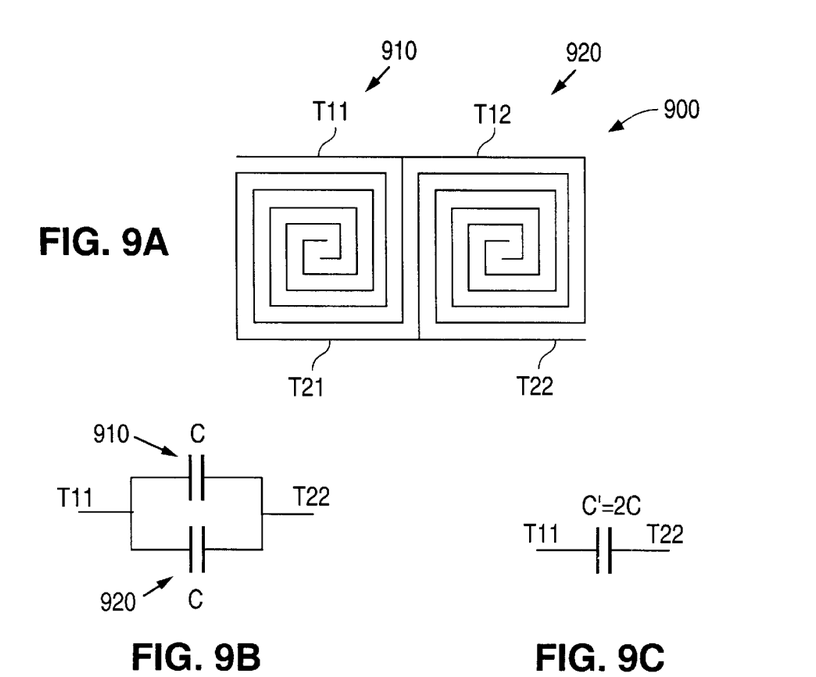
FIG. 9A is a plan view illustrating a spiral capacitor structure 900 in accordance with the present invention.
FIG. 9B is a circuit symbol representing capacitor structure 900 in accordance with the present invention.
FIG. 9C is an alternate circuit symbol representing capacitor structure 900 in accordance with the present invention.

FIG. 9A shows a plan view that illustrates a spiral capacitor structure 900 in accordance with the present invention. FIG. 9B shows a circuit symbol that represents capacitor structure 900, while FIG. 9C shows an alternate circuit symbol that represents capacitor structure 900 in accordance with the present invention.

As shown in FIG. 9A, capacitor structure 900 includes a first capacitor 910 and a second capacitor 920. First capacitor 910 has a first trace T11, a second trace T21, and can be implemented as capacitor 600 or capacitor 700. Second capacitor 920 has a first trace T12, a second trace T22, and can be implemented as capacitor 600 or capacitor 700.

In capacitor 900, the first leg of metal trace T11 of first capacitor 910 and the first leg of metal trace T12 of second capacitor 920 are connected together. In addition, the second leg of metal trace T21 of first capacitor 910 and the second leg of metal trace T22 of second capacitor 920 are connected together. The result, as shown in FIGS. 8B–8C, is that capacitor structure 900 is the electrical equivalent of two capacitors (600 or 700) in parallel.

It should be understood that various alternatives to the method of the invention described herein may be employed in practicing the invention. Thus, it is intended that the following claims define the scope of the invention and that methods and structures within the scope of these claims and their equivalents be covered thereby.

What is claimed is:

1. A capacitor formed on a semiconductor material of a first conductivity type, the capacitor including:
   a first layer of isolation material formed on the semiconductor material;
   a first metal trace formed on the first layer of isolation material, the first metal trace having a first center point, a first end point, and a spiral shape with loops that extends away from the first center point to the first end point; and
   a second metal trace formed on the first layer of isolation material, the second metal trace having a second center point, a second end point, and a spiral shape with loops that extends away from the second center point to the second end point, the second metal trace being formed between the loops of the first metal trace, and around the first metal trace.

2. The capacitor of claim 1 wherein the second metal trace lies adjacent to the first center point.

3. The capacitor of claim 2 wherein the second center point is formed within a first half loop of the first metal trace from the first center point.

4. The capacitor of claim 1 and further comprising:
   a second layer of isolation material formed on the layer of isolation material, the first metal trace, and the second metal trace;
   a third metal trace formed on the second layer of isolation material, the third metal trace having a third center point, a third end point, and a spiral shape with loops that extends away from the third center point to the third end point; and
   a fourth metal trace formed on the second layer of isolation material, the fourth metal trace having a fourth center point, a fourth end point, and a spiral shape that extends away from the fourth center point to the fourth end point, the fourth trace being formed between the loops of the third metal trace, and around the third metal trace.

5. The capacitor of claim 4 wherein the second metal trace lies adjacent to the first center point, and the fourth metal trace lies adjacent to the third center point.

6. The capacitor of claim 5 wherein the fourth center point is formed within a first half loop of the third trace from the fourth center point.

7. The capacitor of claim 4 and further comprising:
   a plurality of first vias formed in the second layer of isolation material to make an electrical connection with the first trace and the third trace; and
   a plurality of second vias formed in the second layer of isolation material to make an electrical connection with the second trace and the fourth trace.

8. The capacitor of claim 7 wherein the third trace is formed to be vertically over the first trace.

9. The capacitor of claim 8 wherein the fourth trace is formed to be vertically over the second trace.

10. The capacitor of claim 4 wherein the third trace is formed to be vertically over the first trace.

11. The capacitor of claim 10 wherein the fourth trace is formed to be vertically over the second trace.

12. The capacitor of claim 1 and further comprising a well of a second conductivity type formed in the semiconductor material, the first metal trace and the second metal trace being formed over the well.

13. The capacitor of claim 12 and further comprising:
a second layer of isolation material formed on the first layer of isolation material, the first metal trace, and the second metal trace;
a third metal trace formed on the second layer of isolation material, the third metal trace having a third center point, a third end point, and a spiral shape with loops that extends away from the third center point to the third end point; and
a fourth metal trace formed on the second layer of isolation material, the fourth metal trace having a fourth center point, a fourth end point, and a spiral shape that extends away from the fourth center point to the fourth end point, the fourth center point being formed between the loops of the third metal trace, and around the third metal trace.

14. A capacitor formed on a semiconductor material of a first conductivity type, the capacitor including:
a plurality of layers of isolation material formed over the semiconductor material, a first layer of isolation material being formed on the semiconductor material, other than the first layer of isolation material, each layer of isolation material being formed on a preceding layer of isolation material;
a plurality of spaced apart metal layers corresponding to the plurality of layers of isolation material, each metal layer being formed on a corresponding layer of isolation material and having a first metal trace and a second metal trace,
the first metal trace having a first center point, a first end point, and a spiral shape with loops that extends away from the first center point to the first end point; and
the second metal trace having a second center point, a second end point, and a spiral shape that extends away from the second center point to the second end point, the second metal trace being formed between the loops of the first metal trace, and around the first metal trace; and
a plurality of vias formed in the second and greater layers of isolation material, the vias making electrical connections between each vertically adjacent first metal trace, and each vertically adjacent second metal trace.

15. The capacitor of claim 14 wherein the second metal trace lies adjacent to the first center point.

16. The capacitor of claim 14 and further comprising a well of a second conductivity type formed in the semiconductor material, a first metal layer of the plurality of metal layers is formed over the well.

17. The capacitor of claim 14 wherein the first traces in the metal layers are formed vertically over each other.

18. The capacitor of claim 17 wherein the second traces in the metal layers are formed vertically over each other.

19. The capacitor of claim 14 and further comprising:
a plurality of first bridges formed on a top layer of isolation material over loops of a first metal trace of a top layer of capacitor metal;
a plurality of first bridge vias that make an electrical connection with the first bridges and loops of the first metal trace of the top layer of capacitor metal;
a plurality of second bridges formed on the top layer of isolation material over loops of a second metal trace of the top layer of capacitor metal; and
a plurality of second bridge vias that make an electrical connection with the second bridges and loops of the second metal trace of the top layer of capacitor metal.

20. The capacitor of claim 18 wherein
the first traces in the metal layers are formed vertically over each other; and
the second traces in the metal layers are formed vertically over each other.

* * * * *

UNITED STATES PATENT AND TRADEMARK OFFICE
CERTIFICATE OF CORRECTION

PATENT NO.    : 6,661,079 B1
DATED         : December 9, 2003
INVENTOR(S)   : Bikulcius It is certified that error appears in the above-identified patent and that said Letters Patent is hereby corrected as shown below:

<u>Column 3,</u>
Line 29, delete "increase" and replace with -- increased --.
Line 31, after "with" insert -- the --.
Line 32, after "line" delete "of".
Line 36, delete "8" and replace with -- 8A --.

Signed and Sealed this

Ninth Day of March, 2004

JON W. DUDAS
*Acting Director of the United States Patent and Trademark Office*